United States Patent
Kaneko et al.

(10) Patent No.: US 7,265,427 B2
(45) Date of Patent: Sep. 4, 2007

(54) SEMICONDUCTOR APPARATUS AND METHOD OF MANUFACTURING THE SEMICONDUCTOR APPARATUS

(75) Inventors: Akio Kaneko, Kawasaki (JP); Kazuhiro Eguchi, Chigasaki (JP); Seiji Inumiya, Yokohama (JP); Katsuyuki Sekine, Yokohama (JP); Motoyuki Sato, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 19 days.

(21) Appl. No.: 10/927,115

(22) Filed: Aug. 27, 2004

(65) Prior Publication Data

US 2005/0110101 A1 May 26, 2005

(30) Foreign Application Priority Data

Aug. 29, 2003 (JP) .............. 2003-305779

(51) Int. Cl.
*H01L 29/76* (2006.01)
*H01L 29/94* (2006.01)
*H01L 31/062* (2006.01)
*H01L 31/113* (2006.01)

(52) U.S. Cl. .............. 257/410; 257/411; 257/412; 257/413

(58) Field of Classification Search .............. 257/410, 257/411, 412, 413
See application file for complete search history.

(56) References Cited

U.S. PATENT DOCUMENTS 5,472,894 A * 12/1995 Hsu et al. ............... 438/282
5,660,681 A * 8/1997 Fukuda et al. ........... 438/695
6,132,806 A * 10/2000 Dutartre ............... 427/255.18
6,858,547 B2 * 2/2005 Metzner et al. ........... 438/785

FOREIGN PATENT DOCUMENTS

| JP | 2002-170825 | 6/2002 |
|----|-------------|--------|
| JP | 2002-280461 | 9/2002 |
| JP | 2003-008011 | 1/2003 |
| JP | 2003-152101 | 5/2003 |
| JP | 2003-204061 | 7/2003 |

* cited by examiner

*Primary Examiner*—Sara Crane
*Assistant Examiner*—Samuel A. Gebremariam
(74) *Attorney, Agent, or Firm*—Finnegan, Henderson, Farabow, Garrett & Dunner, L.L.P.

(57) ABSTRACT

A semiconductor apparatus wherein a device formed on a semiconductor substrate comprises a gate insulating film including a high dielectric constant film formed on the substrate and an anti-reaction film formed on the high dielectric constant film, and a gate electrode formed on the anti-reaction film, the high dielectric constant film comprises a film containing at least one of Hf and Zr, and Si and O, or a film containing at least one of Hf and Zr, and Si, O and N, the anti-reaction film comprises an $SiO_2$ film, a film containing $SiO_2$ as a main component and at least one of Hf and Zr, a film containing $SiO_2$ as a main component and N, a film containing $SiO_2$ as a main component, Hf and N, a film containing $SiO_2$ as a main component, Zr and N, or a film containing $SiO_2$ as a main component, Hf, Zr and N.

13 Claims, 9 Drawing Sheets

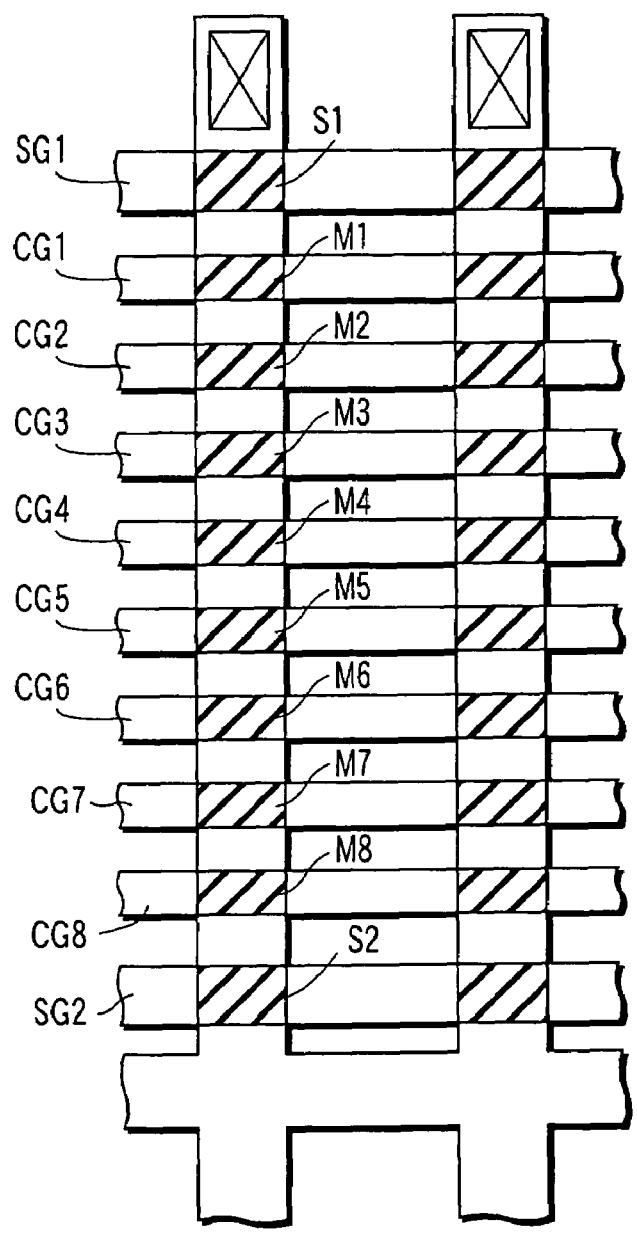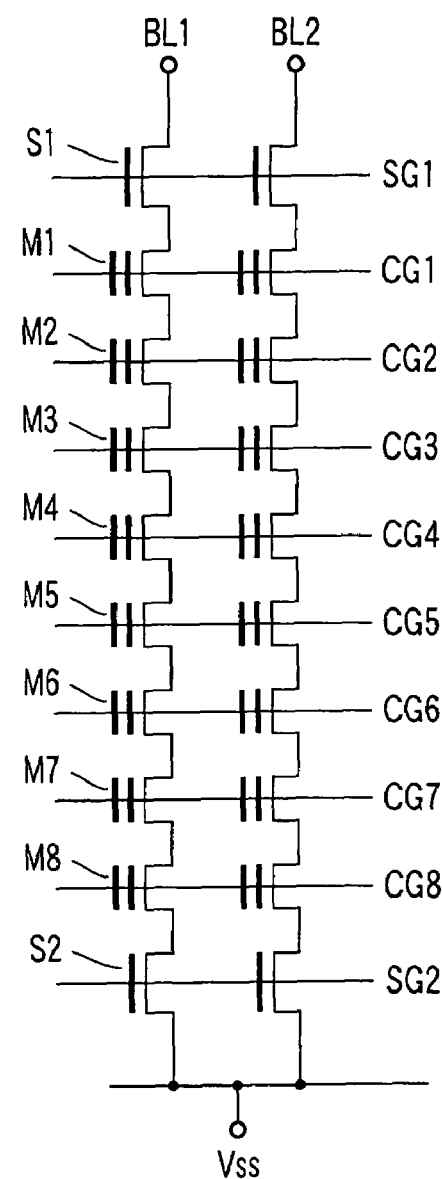
F I G. 22    F I G. 23

SEMICONDUCTOR APPARATUS AND METHOD OF MANUFACTURING THE SEMICONDUCTOR APPARATUS

CROSS-REFERENCE TO RELATED APPLICATIONS

This application is based upon and claims the benefit of priority from prior Japanese Patent Application No. 2003-305779, filed Aug. 29, 2003, the entire contents of which are incorporated herein by reference.

BACKGROUND OF THE INVENTION

1. Field of the Invention

The present invention relates to a semiconductor apparatus, and in particular, to a semiconductor apparatus in which a transistor using a high dielectric constant film whose dielectric constant is greater than that of a conventional gate insulating film for a gate structure is formed in a semiconductor substrate, and a method of manufacturing the semiconductor apparatus.

2. Description of the Related Art

In recent years, elements have become minute due to the high-integration and increase in speed of semiconductor apparatuses such as a large-scale integration (LSI). Accompanying these, in a MOS structure which is a component of a function device such as a capacitor or a transistor, it has been required that an $SiO_2$ gate insulating film is further made thinner. However, when a film thickness of a silicon oxide film is less than or equal to 3 nm, because-electrons come to bring about direct tunneling in an electric field region where the device operates, the problem that a leakage current is increased and an electric power consumption of the device is increased is brought about. Therefore, a next-generation gate insulating film which can be replaced with the silicon oxide film has been required. Then, recently, a high dielectric constant film whose relative dielectric constant is higher than that of the silicon oxide film has been paid attention. The reason for this is that the high dielectric constant film with a film thickness thicker than that of the silicon oxide film can obtain the same capacitance as that of the silicon oxide film. Due to the film thickness of an insulating film being made thicker, it is possible to reduce a probability in which electrons tunnel through the insulating film, i.e., it is possible to suppress the generation of a tunnel current.

Then, as a high dielectric constant gate insulating film replaced with an $SiO_2$ film, for example, a hafnium silicate (Hf-silicate) film or the like is cited as a candidate. Further, a generally used manufacturing method such as a chemical vapor deposition (CVD) method is preferably used at the time of manufacturing a large-scale integration (LSI).

When a manufacturing method which has been generally used is used, it is necessary to use a general silicon as a gate electrode. However, when a silicon gate is used, a fixed charge is generated in the vicinity of the interface between the silicon gate electrode and the hafnium silicate gate insulating film. Accordingly, in particular, in a case of a p-channel metal oxide semiconductor (MOS) transistor, a change in a threshold value of 0.6 V or more than an ideal value arises. Therefore, there has been the problem that it is difficult to design the LSI.

As a prior art using a high dielectric constant film as a gate insulating film, in Jpn. Pat. Appln. KOKAI Publication No. 2003-152101, there is disclosed that a high dielectric substance whose relative dielectric constant is greater than that of a silicon nitride film, for example, a group 4A elemental oxide such as a $ZrO_2$ film or an $HfO_2$ film, a $Ta_2O_5$ film or the like is used as a gate insulating film. Further, in Jpn. Pat. Appln. KOKAI Publication No. 2002-170825, there is disclosed that a gate insulating film is formed by combining a silicon oxide/nitride film with a relative dielectric constant of 5 to 7 and a high dielectric constant film (an oxide of a metal such as Zr, Hf, La, Ti, Ta, Y or Al). Furthermore, in Jpn. Pat. Appln. KOKAI Publication No. 2002-280461, there is disclosed that a gate insulating film is composed of a first insulating film which is a low dielectric constant film and a second insulating film which is a high dielectric constant film. One of a silicon oxide film, a silicon nitride film, and a silicon oxide/nitride film is used as the low dielectric constant film, and one of $TiO_2$, $ZrO_2$, $HfO_2$, $PrO_2$, and the like, or a mixture of two or more thereof is used as the high dielectric constant film.

As described above, when a manufacturing method which has been generally used is used, it is necessary to use a general silicon as a gate electrode. However, when a silicon gate is used, a fixed charge is generated in the vicinity of the interface between the silicon gate electrode and the hafnium silicate gate insulating film. Accordingly, in particular, in a case of a p-channel metal oxide semiconductor (MOS) transistor, a change in a threshold value of 0.6 V or more than an ideal value arises. Therefore, there has been the problem that it is difficult to design the LSI.

BRIEF SUMMARY OF THE INVENTION

According to an aspect of the present invention, there is provided a semiconductor apparatus comprising:

a semiconductor substrate; and a function device formed on the semiconductor substrate, wherein the function device comprises a gate structure including a gate insulating film which is formed of a high dielectric constant film formed on the semiconductor substrate, an anti-reaction film formed on the high dielectric constant film, and a gate electrode formed on the anti-reaction film, the high dielectric constant film comprises a film made of a material containing at least one of Hf and Zr, and Si and O, or a film made of a material containing at least one of Hf and Zr, and Si, O and N, the anti-reaction film comprises an $SiO_2$ film, a film made of a material containing $SiO_2$ as a main component and at least one of Hf and Zr, a film made of a material containing $SiO_2$ as a main component and N, a film made of a material containing $SiO_2$ as a main component, Hf and N, a film made of a material containing $SiO_2$ as a main component, Zr and N, or a film made of a material containing $SiO_2$ as a main component, Hf, Zr and N, in which when the anti-reaction film contains one of Hf and Zr, a composition ratio of Hf or Zr is less than 1 atom %, when the anti-reaction film contains Hf and Zr, a total composition ratio of Hf and Zr is less than 1 atom %, and when the anti-reaction film contains N, a composition ratio of N is less than 20 atom %.

According to another aspect of the present invention, there is provided a method of manufacturing a semiconductor apparatus comprising:

forming a high dielectric constant film on a semiconductor substrate, the high dielectric constant film comprising a film made of a material containing at least one of Hf and Zr, and Si and O, or a film made of a material containing at least one of Hf and Zr, and Si, O and N, forming on the high dielectric constant film an anti-reaction film forming a gate insulation film together with the high dielectric constant film, the anti-reaction film comprising an $SiO_2$ film, a film made of a material containing $SiO_2$ as a main component and at least one of Hf and Zr, a film made of a material containing $SiO_2$ as a main component and N, a film made of a material containing $SiO_2$ as a main component, Hf and N, a film made of a material containing $SiO_2$ as a main component, Zr and N, or a film made of a material containing $SiO_2$ as a main component, Hf, Zr and N, in which when the anti-reaction film contains one of Hf and Zr, a composition ratio of Hf or Zr is less than 1 atom %, when the anti-reaction film contains Hf and Zr, a total composition ratio of Hf and Zr is less than 1 atom %, and when the anti-reaction film contains N, a composition ratio of N is less than 20 atom %, and forming a gate electrode on the anti-reaction film, the gate electrode forming a gate structure together with the gate insulating film.

BRIEF DESCRIPTION OF THE SEVERAL VIEWS OF THE DRAWING

FIG. 22 is a plan pattern view of a NAND type flash memory.

FIG. 23 is an equivalent circuit diagram of the NAND type flash memory shown in FIG. 22.

DETAILED DESCRIPTION OF THE INVENTION

Hereinafter, embodiments of the present invention will be described with reference to the accompanying drawings.

FIRST EMBODIMENT

Figure 1:
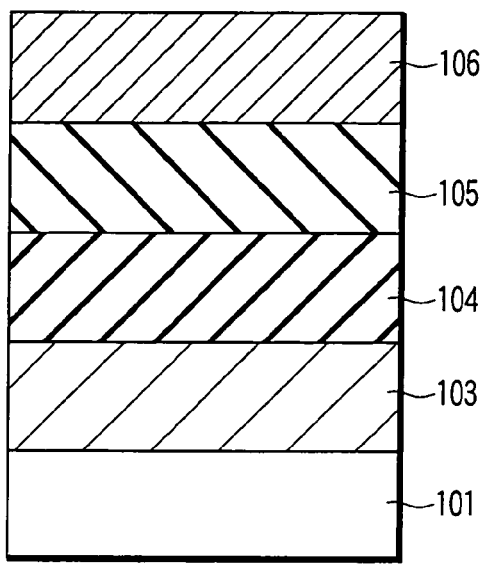
FIG. 1 is a sectional view of a MOS structure according to a first embodiment of the present invention.
Figure 3:
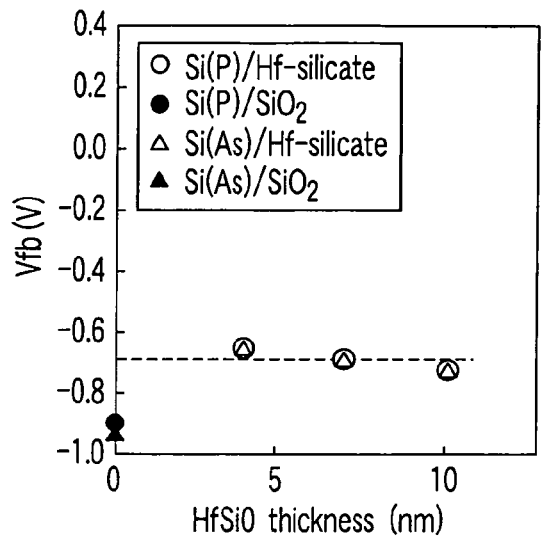
FIG. 3 is a characteristic diagram showing the dependence of a flat band voltage on a gate insulating film thickness.
Figure 2:
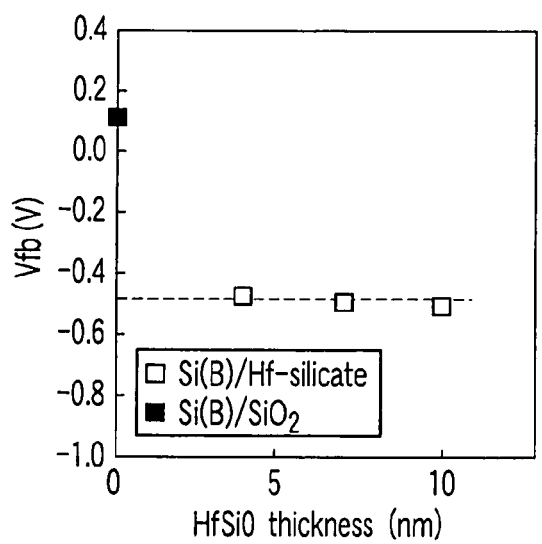
FIG. 2 is a characteristic diagram showing the dependence of a flat band voltage on a gate insulating film thickness.

FIG. 1 is a sectional view of a metal oxide semiconductor (MOS) structure formed on a silicon semiconductor substrate according to a first embodiment of the present invention, and FIGS. 2 and 3 are characteristic diagrams showing the dependence of a flat band voltage on a gate insulating film thickness. A generally called MOS structure formed on a silicon semiconductor substrate is applied to a function device such as a capacitor or a transistor. In the present embodiment, an example in which the MOS structure is applied to a transistor will be described.

Source/drain regions (not shown) are formed on a surface region of a silicon semiconductor substrate 101, and a channel region 103 is formed in the silicon semiconductor substrate 101 between the source/drain regions. A high dielectric constant film 104 such as a hafnium silicate (Hf-silicate) film is formed on the channel region 103, and an anti-reaction film 105 such as an $SiO_2$ film is formed on the high dielectric constant film 104. The high dielectric constant film 104 and the anti-reaction film 105 constitute a gate insulating film. A polycrystalline silicon gate electrode 106 is formed on the anti-reaction film 105. The substrate is not limited to a silicon semiconductor substrate, and an SOI substrate can be used.

Here, the aforementioned high dielectric constant film is $(MO_2)_x(SiO_2)_{1-x}$, where $0.01 < x \leq 1$ and M is a quadrivalent metal. As M, Hf and Zr can be cited. Note that N (nitrogen) may be contained therein. When N (nitrogen) is contained, a composition ratio of O (oxygen) in the above-described equation is made small.

Any of a vapor deposition method, a sputtering method, a sol-gel method, a laser ablation method, and a chemical vapor deposition (CVD) method may be used as a method of forming the high dielectric constant film including a hafnium silicate film. For example, by using a CVD method, a hafnium silicate film formed from Hf, Si, and O can be formed by simultaneously supplying TEOS $(Si(OC_2H_5)_4)$ and HTB $(Hf(OC(CH_3)_3)_4)$ and $O_2$ thereto at 1 Torr and 600° C. A composition ratio Hf/(Hf+Si) can be varied by adjusting the quantity of supplying TEOS and HTB. Further, a film thickness can be varied by adjusting the time of supplying TEOS and HTB.

Further, after a hafnium silicate film (HfSiO film) consisting of Hf, Si, and O is formed, for example, by using a CVD method, heat treatment is carried out onto the substrate for five minutes at 100 Torr and 800° C. in an $NH_3$ atmosphere, whereby nitrogen N is introduced into the hafnium silicate film, and for example, it can be made to be a hafnium silicate film (HfSiON film) in which the composition ratio of N is(N/(Hf+Si+O+N))=about 10 to 20 atom %.

The anti-reaction film 105 is preferably formed from $SiO_2$. However, 20 atom % or less N and 1 atom % or less Hf (metal M in a high dielectric constant film in the broad sense) may be contained therein. It is not preferable that N is over 20 atom %, which generates a positive fixed charge in the anti-reaction film 105. It is not preferable that Hf is over 1 atom %, which generates a positive fixed charge between the anti-reaction film 105 and the polycrystalline silicon gate electrode 106.

Further, in order to sufficiently obtain the advantage that the gate insulating film is a high dielectric constant film, the film thickness of the anti-reaction film 105 is preferably thinner than the film thickness of the high dielectric constant film 104. It is more preferable that a film thickness in which the anti-reaction film 105 is converted into $SiO_2$ is thinner than a film thickness in which the high dielectric constant film 104 is converted into $SiO_2$. For example, when a hafnium silicate film in which a composition ratio of Hf is (Hf/(Hf+Si))=30% and the film thickness is 4 nm is used as the high dielectric constant film 104, the relative dielectric constant is about 8. Therefore, as the anti-reaction film 105 formed from $SiO_2$ whose relative dielectric constant is 3.9, the film thickness is preferably less than or equal to 2 nm. Note that, when N or Hf is contained in the anti-reaction film 105, because the relative dielectric constant of $SiO_2$ becomes high, the film thickness of the anti-reaction film 105 may be made thicker than that in the case where N or Hf is not contained in the anti-reaction film 105.

In the present embodiment, the gate electrode 106 is to be a polycrystalline silicon gate electrode. However, the gate electrode 106 may be a polycrystalline silicon gate electrode containing a dopant. Further, for example, the gate electrode 106 may be a gate electrode using silicon germanium (SiGe) into which B, P, As, or the like is injected, or may be a high refractory metallic silicide gate electrode using tungsten silicide (WSi) or the like.

FIGS. 2 and 3 are respectively characteristic diagrams showing the dependence of a flat band voltage on a gate insulating film thickness, and the ordinate denotes a flat band voltage Vfb(V), and the abscissa denotes a film thickness (nm) of a hafnium silicate film.

The characteristics of FIGS. 2 and 3 are to plot the flat band voltages which had been respectively obtained, as an gate insulating film on a p-type silicon semiconductor substrate by using polycrystalline silicon as a gate electrode, in a case where a hafnium silicate film in which a composition ratio of Hf is Hf/(Hf+Si)=30% and the film thickness is 4 nm is formed, a case where a hafnium silicate in which a composition ratio of Hf is Hf/(Hf+Si)=30% and the film thickness is 7 nm is formed, and a case where a hafnium silicate in which a composition ratio of Hf is Hf/(Hf+Si) =30% and the film thickness is 10 nm is formed. The flat band voltages Vfb shown in FIG. 2 are flat band voltages Vfb when B (boron) is doped in the polycrystalline silicon gate electrode, and the flat band voltages Vfb shown in FIG. 3 are flat band voltages Vfb when P (phosphorus) is doped in the polycrystalline silicon gate electrode, and flat band voltages Vfb when As (arsenic) is doped in the polycrystalline silicon gate electrode.

In FIGS. 2 and 3, flat band voltages obtained in a case where the gate insulating film is formed from $SiO_2$ formed by thermal oxidation are plotted. In FIGS. 2 and 3, the dependence of the flat band voltage Vfb of the hafnium silicate (HfSiO) film on a film thickness is small, and a difference with the flat band voltage Vfb of the $SiO_2$ film shows that a fixed charge exists in the vicinity of the polycrystalline silicon gate electrode of the hafnium silicate film. It can be understood that, when B (boron) is doped in the polycrystalline silicon gate electrode (FIG. 2), the flat band voltages Vfb of the hafnium silicate film are shifted in the negative direction about 0.6 to 0.7 V with respect to the flat band voltage Vfb of the $SiO_2$ film, and a positive fixed charge is generated. It can be understood that, when P (phosphorus) is doped in and As (arsenic) is doped in the gate electrode (FIG. 3), the flat band voltages Vfb of the hafnium silicate (Hf-silicate) are shifted in the positive direction about 0.2 to 0.3 V with respect to the flat band voltages Vfb of the $SiO_2$ film, and a negative fixed charge is generated.

Note that, when the high dielectric constant film 104 is formed by using only TEOS, i.e., when a composition ratio of Hf is Hf/(Hf+Si)=0%, a flat band voltage Vfb was not generated. Further, when the gate electrode 106 is formed from $SiO_{0.8}Ge_{0.2}$ as well, the flat band voltage Vfb shows the trend in the same way as FIGS. 2 and 3. Accordingly, in accordance with the results therefrom, it can be understood that a fixed charge is generated when there are Hf, Si, and a dopant.

In order to prevent B, P, As, or the like from being diffused to the semiconductor substrate, a thin film, for example, an SiON film of about 0.6 nm may be formed in advance on the semiconductor substrate before the gate insulating film is formed. This is because B, P, As or the like is prevented from being diffused up to the semiconductor substrate at the time of heat treatment in the process of manufacturing an LSI.

As described above, in the present embodiment, an anti-reaction film formed from a silicon oxide film is provided between a silicate based gate insulating film including hafnium and a polycrystalline silicon gate electrode. Therefore, it is possible to suppress a fixed charge.

SECOND EMBODIMENT

Figure 4:
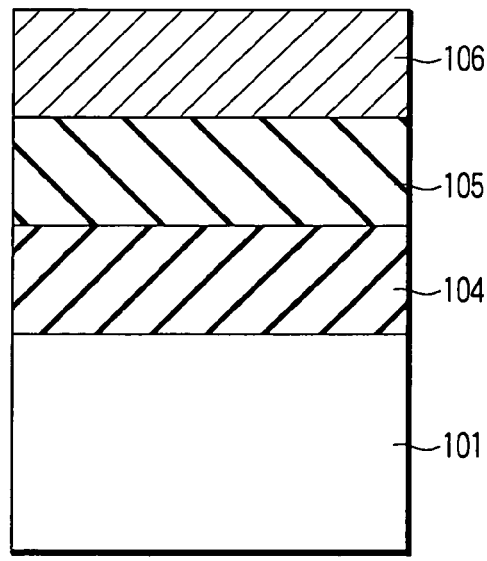
FIG. 4 is a sectional view of a MOS structure capacitor according to a second embodiment of the present invention.

FIG. 4 is a second embodiment of the present invention, and in this embodiment, an example in which the MOS structure is applied to a capacitor will be described.

The high dielectric constant film 104 such as a hafnium silicate is formed on a predetermined region of the silicon semiconductor substrate 101, and the anti-reaction film 105 such as $SiO_2$ is formed on the high dielectric constant film 104. The high dielectric constant film 104 and the anti-reaction film 105 constitute a dielectric substance film. The polycrystalline silicon electrode 106 is formed on the anti-reaction film 105. In accordance with such a constitution, a capacitor of the MOS structure is composed of one side electrode including the silicon semiconductor substrate 101, the dielectric substance film including the high dielectric constant film 104 and the anti-reaction film 105, and the other side electrode including the polycrystalline silicon electrode 106, and the same effect as in the transistor having the MOS structure described in the first embodiment can be obtained. Further, various modifications are possible in the same way as in the transistor having the MOS structure described in the first embodiment.

THIRD EMBODIMENT

Next, a third embodiment of the present invention will be described with reference to FIGS. 5 to 11.

FIGS. 5 to 11 are sectional views in respective processes of manufacturing a semiconductor apparatus according to the third embodiment of the present invention.

In this embodiment, processes of manufacturing an nMOS transistor will be described. However, a pMOS transistor as well is formed on the same silicon semiconductor substrate in the same processes. Namely, the present embodiment can be applied to a CMOS semiconductor apparatus. Moreover, this embodiment can be applied to a MOSFET of an SOI substrate as well, and can be also applied to a vertical MOS transistor (there is a channel in the vertical direction on the substrate, and electrons and holes run along it vertically with respect to the substrate).

Figure 5:
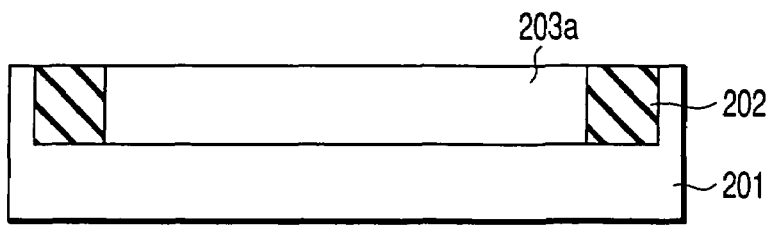
FIG. 5 is a sectional view of a semiconductor structure, for explaining a step of manufacturing a MOS transistor according to a third embodiment of the present invention.

First, as shown in FIG. 5, isolation regions 202 are formed by burying a $SiO_2$ film into trenches for isolation of a p-type silicon semiconductor substrate 201. Thereafter, a resist pattern, in which only the isolation region divided by the isolation regions 202 is opened, is formed by a photolithography method on the semiconductor substrate 201, and an n-type channel region 203a is formed by injecting a dopant, for example, B (boron) into the semiconductor substrate 201 from the opening portion by using the resist pattern as a mask. For example, the n-type channel region 203a is formed ion-implanting B (boron) into the semiconductor substrate 201 at an accelerating voltage of 20 keV and a dopant dose of $1 \times 10^{13}$ cm$^{-3}$, and next, activating As (arsenic) by annealing for twenty minutes at 1000° C. in an $N_2$ atmosphere.

Figure 6:
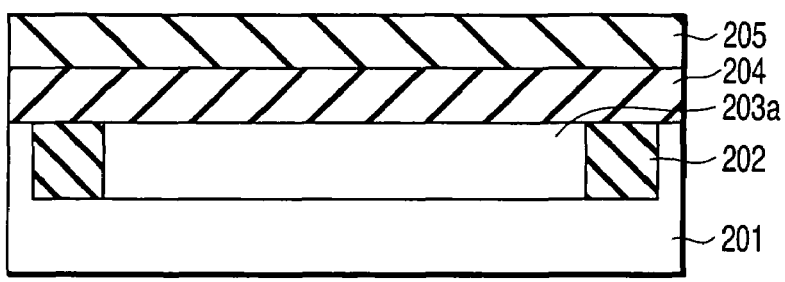
FIG. 6 is a sectional view of a semiconductor structure, for explaining a step of manufacturing the MOS transistor according to the third embodiment of the present invention.

Next, as shown in FIG. 6, a hafnium silicate film 204 is formed so as to be about 4 nm as a gate insulating film. Namely, the hafnium silicate film 204 in which a composition ratio of Hf is Hf/(Hf+Si)=30% is accumulated to be formed by simultaneously supplying TEOS ($Si(OC_2H_5)_4$), HTB ($Hf(OC(CH_3)_3)_4$), and $O_2$ at 1 Torr and 600° C. by a CVD method. Subsequently, $SiO_2$ is formed so as to be about 1 nm as an anti-reaction film 205. The anti-reaction film 205 is accumulated to be formed by simultaneously supplying TEOS ($Si(OC_2H_5)_4$) at 1 Torr and 600° C. by a CVD method.

Figure 7:
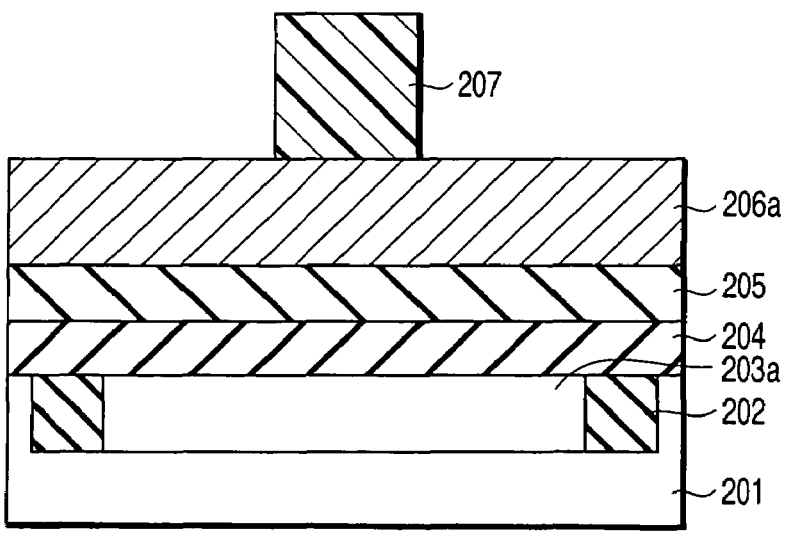
FIG. 7 is a sectional view of a semiconductor structure, for explaining a step of manufacturing the MOS transistor according to the third embodiment of the present invention.

Next, as shown in FIG. 7, a polycrystalline silicon film which will be a gate electrode 206a is accumulated so as to be 100 nm at 620° C. by using a mixed gas of $SiH_4$, $N_2$, and $H_2$. Subsequently, a gate electrode portion of the polycrystalline silicon film is covered with a resist pattern 207 by a photolithography method.

Figure 8:
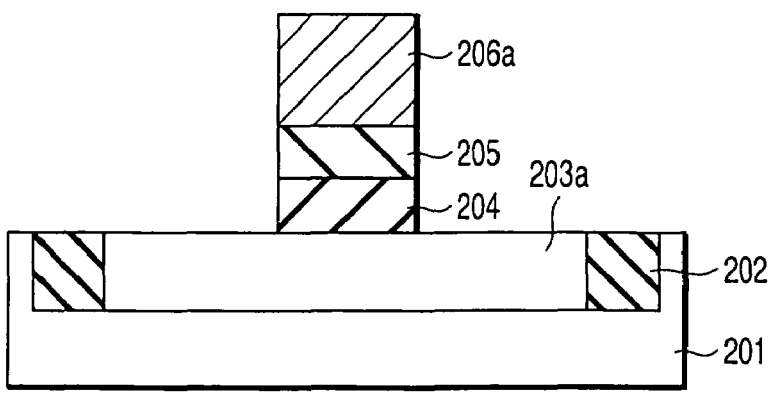
FIG. 8 is a sectional view of a semiconductor structure, for explaining a step of manufacturing the MOS transistor according to the third embodiment of the present invention.

Next, as shown in FIG. 8, by using the photoresist 207 as a mask, a gate electrode 206a is formed by processing the polycrystalline silicon film by RIE (Reactive Ion Etching) in a $CF_4$ and $O_2$ atmosphere. Thereafter, by using the gate electrode 206a as a mask, the anti-reaction film ($SiO_2$) 205 and the high dielectric constant film 204 formed from hafnium silicate are processed by using a solution containing HF. When the high dielectric constant film is formed from HfSiON, it is appropriate that the anti-reaction film and the composition ratio of N is N/(Hf+Si+O+N)=10 to 20 atom % around.

Figure 9:
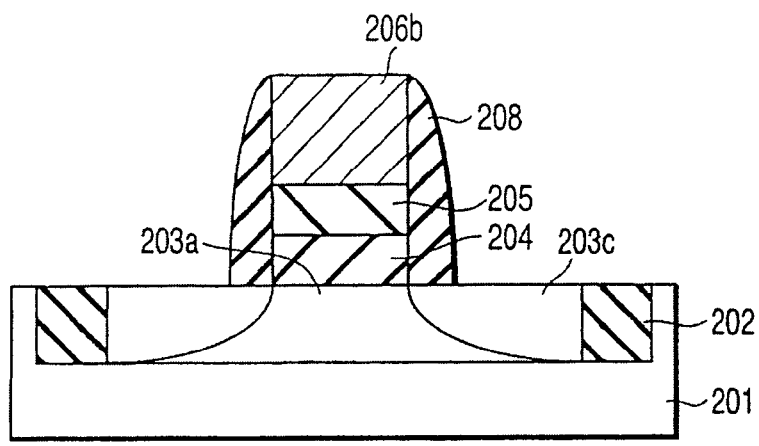
FIG. 9 is a sectional view of a semiconductor structure, for explaining a step of manufacturing the MOS transistor according to the third embodiment of the present invention.

Next, as shown in FIG. 9, a silicon oxide ($SiO_2$) film is accumulated on an entire surface of the substrate 201, and then, gate side wall insulating films 208 formed from a silicon oxide film are formed so as to have a thickness of about 5 nm by carrying out RIE etch-back. Subsequently, by using the gate electrode 206a and the side wall insulating films 208 as masks, As is ion-implanted into the semiconductor substrate 201 at an accelerating voltage of 20 keV and a dopant dose of $1 \times 10^{15}$ cm$^{-2}$. Then, the gate electrode 206b formed from n-type silicon and source/drain regions 203b and 203c formed from n-type silicon are formed due to the As (arsenic) being activated by carrying out rapid thermal annealing (RTA) for ten seconds at 1000° C.

Figure 10:
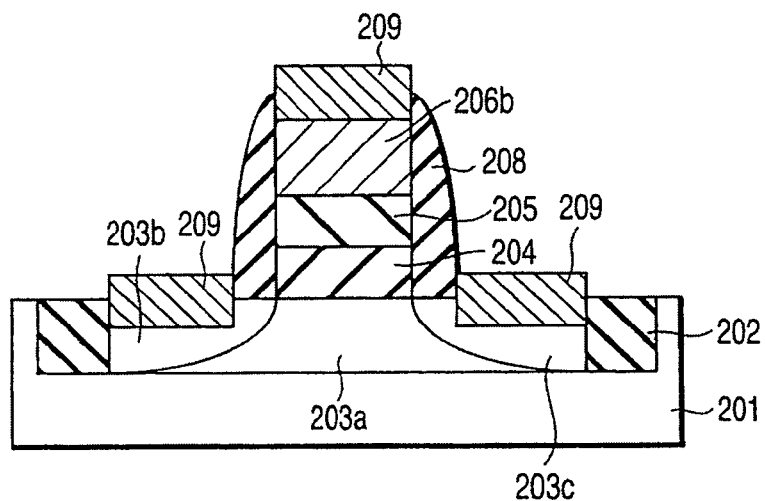
FIG. 10 is a sectional view of a semiconductor structure, for explaining a step of manufacturing the MOS transistor according to the third embodiment of the present invention.

Next, after Co (cobalt) is accumulated on the entire surface of the substrate 201, heat treatment is carried out thereon, and thereafter, the residual Co is peeled off, whereby, as shown in FIG. 10, cobalt silicide ($CoSi_2$) films 209 are formed on the gate electrode 206b and the source/drain regions 203b and 203c.

Figure 11:
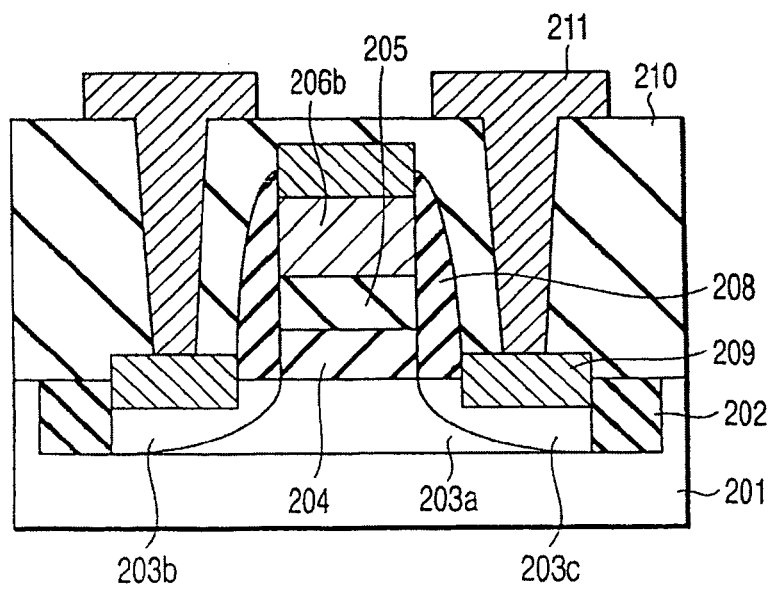
FIG. 11 is a sectional view of a semiconductor structure, for explaining a step of manufacturing the MOS transistor according to the third embodiment of the present invention.

Next, as shown in FIG. 11, for example, an interlayer insulating film 210 formed from $SiO_2$ is accumulate on the entire surface of the substrate 201 by using TEOS as a material, and then, the interlayer insulating film 210 is flattened by chemical mechanical polishing (CMP). Subsequently, contact holes are formed so as to contact the source/drain regions 203b and 203c, and wiring films 211 formed from Al/TiN/Ti, Cu/TiN/Ti, or the like are formed in the contact holes and on the flattened interlayer insulating film 210. The wiring portions of the wiring films 211 in the contact holes electrically connect the wiring portions of the wiring films 211 on the interlayer insulating film 210 and the source/drain regions 203b and 203c. Next, the semiconductor apparatus is completed by carrying out wiring processes from the second layer on.

As described above, in the present embodiment, an anti-reaction film formed from a silicon oxide film is provided between a silicate based gate insulating film including hafnium and a polycrystalline silicon gate electrode. Therefore, it is possible to suppress a fixed charge.

Figure 12:
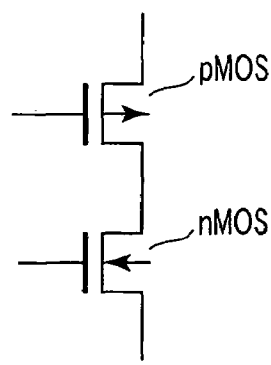
FIG. 12 is a circuit diagram of a CMOS transistor.

Although not illustrated, a p-channel transistor which is complementary to the n-channel MOS transistor as well is formed on the semiconductor substrate 201, and as shown in FIG. 12, complementary MOS (CMOS) transistors are constituted. The p-channel transistor is formed in the same way as the n-channel transistor in a p-type well (not shown) formed at the semiconductor substrate 201.

FOURTH EMBODIMENT

Next, a fourth embodiment of the present invention will be described with reference to FIGS. 13 to 16.

FIGS. 13 to 16 are sectional views in respective processes of manufacturing a semiconductor apparatus according to the fourth embodiment of the present invention.

In this embodiment, processes of manufacturing an nMOS transistor will be described. However, a pMOS transistor as well is formed on the same silicon semiconductor substrate in the same processes. Namely, the present embodiment can be applied to a CMOS semiconductor apparatus. Moreover, this embodiment can be applied to a MOSFET of an SOI substrate as well, and can be also applied to a vertical MOS transistor.

Figure 13:
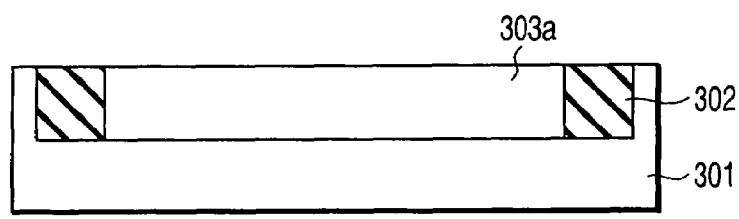
FIG. 13 is a sectional view of a semiconductor structure, for explaining a step of manufacturing a MOS transistor according to a fourth embodiment of the present invention.

First, as shown in FIG. 13, isolation regions 302 are formed by burying an $SiO_2$ film into trenches for isolation of a p-type silicon semiconductor substrate 301. Thereafter, a resist pattern, in which only isolation region divided by the isolation regions 302 is opened, is formed on the semiconductor substrate 301 by a photolithography method, and an n-type channel region 303a is formed due to a dopant, for example, As (arsenic) being injected into the semiconductor substrate 301 from the opening portion by using the resist pattern as a mask. For example, the n-type channel region 303a is formed by ion-implanting As (arsenic) into the semiconductor substrate 301 at an accelerating voltage of 20 keV and a dopant dose of $1\times10^{13}$ cm$^{-3}$, and next, activating B by annealing for twenty minutes at 1000° C. in an $N_2$ atmosphere.

Figure 14:
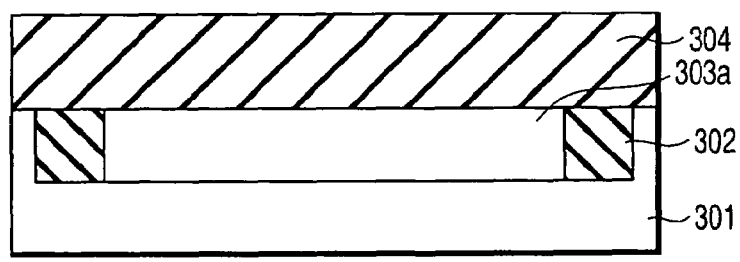
FIG. 14 is a sectional view of a semiconductor structure, for explaining a step of manufacturing the MOS transistor according to the fourth embodiment of the present invention.
Figure 15:
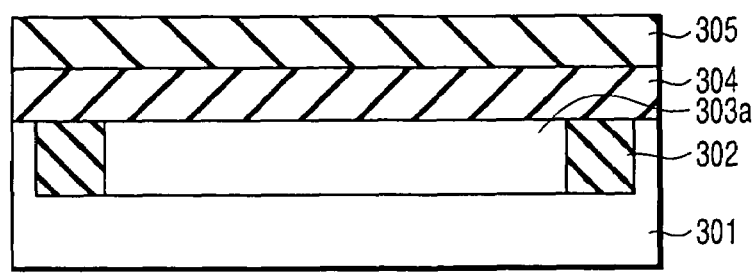
FIG. 15 is a sectional view of a semiconductor structure, for explaining a step of manufacturing the MOS transistor according to the fourth embodiment of the present invention.
Figure 16:
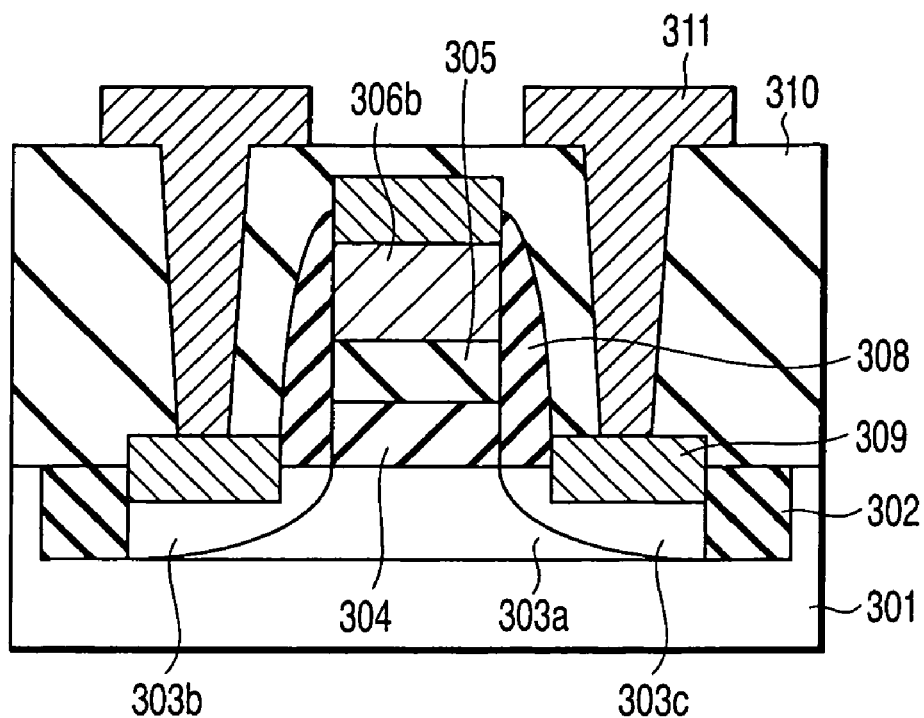
FIG. 16 is a sectional view of a semiconductor structure, for explaining a step of manufacturing the MOS transistor according to the fourth embodiment of the present invention.

Next, as shown in FIG. 14, a high dielectric constant film 304 is formed so as to be about 5 nm by a film-forming method which is the same as the film-forming method of the high dielectric constant film 204 in the third embodiment. Next, the surface layer of the high dielectric constant film 304 is processed by using a mixed aqueous solution of $H_2SO_4/H_2O_2$, and Hf in the surface layer is dissolved and extracted. As a result, an anti-reaction film ($SiO_2$) 305 is formed on the layer portion where Hf has been extracted (FIG. 15). Hereinafter, by executing accumulation of a polycrystalline silicon film, forming of a gate electrode 306b, injection of a dopant and activation of the source/drain regions 303b, 303c, wiring processes, and the like by the same methods as in the third embodiment, the semiconductor apparatus is completed as shown in FIG. 16. In FIG. 16, reference numeral 308 denotes a gate side wall insulating film, and corresponds to the gate side wall insulating film 208 of FIG. 11 in the third embodiment. Reference numeral 309 denotes a cobalt silicide ($CoSi_2$) film, and corresponds to the cobalt silicide ($CoSi_2$) film 209 of FIG. 11. Reference numeral 311 denotes a wiring, and corresponds to the wiring film 211 of FIG. 11.

As described above, in the present embodiment, an anti-reaction film formed from a silicon oxide film is provided between a silicate based gate insulating film including hafnium and a polycrystalline silicon gate electrode. Therefore, it is possible to suppress a fixed charge. Also, in this embodiment, since the anti-reaction film is formed due to Hf in the surface layer being dissolved and extracted by processing the surface layer of the high dielectric constant film, it is easy to manufacture the semiconductor apparatus. Further, various modifications are possible in the same way as in the semiconductor device described in the third embodiment.

Although not illustrated, a p-channel transistor which is complementary to the n-channel MOS transistor as well is formed on the semiconductor substrate 301, and as shown in FIG. 12, complementary MOS (CMOS) transistors are constituted. The p-channel transistor is formed in the same way as the n-channel transistor in a p-type well (not shown) formed at the semiconductor substrate 201.

FIFTH EMBODIMENT

Next, a fifth embodiment of the present invention will be described with reference to FIG. 17.

Figure 17:
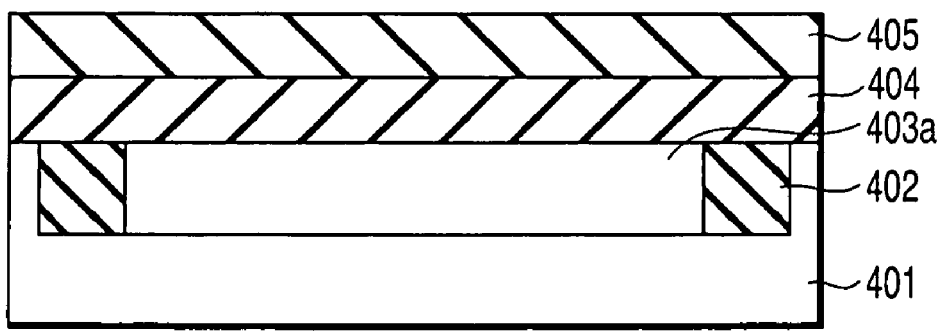
FIG. 17 is a sectional view of a semiconductor structure, for explaining a step of manufacturing a MOS transistor according to a fifth embodiment of the present invention.

FIG. 17 is a sectional view in a process of manufacturing a semiconductor apparatus according to the fifth embodiment.

A method of forming an isolation region 402, a channel region 403a, and a high dielectric constant film (hafnium silicate film) 404 on a silicon semiconductor substrate 401 is the same as, for example, in the third embodiment. The high dielectric constant film may be, for example, HfSiON or the like in addition to HfSiO.

(1) As a raw material of silicon of a $SiO_2$ film which is an anti-reaction film 405 formed by using a CVD method, organic based, halogen based, and hydride based materials in addition to TEOS can be used. Examples of the organic based material include BTBAS ($SiH_2(N(C(CH_3)_3)_2)$) and TDMAS (Si $(N(CH_3)_3)_2$)), examples of the halogen based material include $SiH_2$, $Cl_2$, $SiCl_4$, $Si_2Cl_6$, and $SiF_4$, and examples of the hydride based material include $SiH_4$ and the like. Further, as a gas, a single or a mixed gas which is selected from $O_2$, $H_2O$, $N_2O$, and the like is used in accordance with a material, a film-forming temperature, or the like.

(2) The $SiO_2$ film 405 may be formed by an ALD method using TEOS and $H_2O$. In place of TEOS, as described in the above-described (1), organic based, halogen based, and hydride based materials may be used. Examples of the organic based material include BTBAS ($SiH_2(N(C(CH_3)_3)_2)$) and TDMAS (Si $(N(CH_3)_3)_2$)), examples of the halogen based material includes $SiH_2$, $Cl_2$, $SiCl_4$, $Si_2Cl_6$, and $SiF_4$, and examples of the hydride based material, $SiH_4$ and the like. $O_2$, $O_3$, $H_2O_2$, $N_2O$, or the like may be used in place of $H_2O$.

(3) The $SiO_2$ film 405 may be formed such that by using $SiH_4$, and an Si film is formed in an $H_2/N_2$ atmosphere, and next, the Si film is oxidized. As a method of oxidizing the Si film, for example, annealing is carried out for 30 seconds at 800° C. and 1 Torr in an $O_2$ atmosphere. Or, the Si film may be oxidized by plasma oxidation in an $Ar/O_2$ atmosphere. Or, the Si film may be oxidized by being immersed in an aqueous solution such as $H_2SO_4$, $H_2O_2$, or $HNO_3$, or a mixed solution thereof. Or, the Si film may be oxidized by an anodic oxidation method.

(4) With respect to the $SiO_2$ film 405, the anti-reaction film ($SiO_2$ film) 405 may be formed such that an SiN film is formed in an $NH_3/N_2$ atmosphere by using $SiH_4$ as a raw material of Si, and next, the SiN film is oxidized. As a method of oxidizing the SiN film, for example, the method described in the above-described (3) can be used in which the annealing is carried out for 30 seconds at 800° C. and 1 Torr in an $O_2$ atmosphere. At that time, some of N in the SiN film diffuse into the hafnium silicate film 404, and therefore, the additional effect that the relative dielectric constant is increased can be expected. Further, the materials described in the above-described (1) may be used as a raw material of Si. In that case, as a gas, a single or a mixed gas which is selected from $NH_3$, $N_2H_4$, $H_2$, $N_2$, $N_2O$, and the like is used in accordance with a material, a film-forming temperature, or the like.

(5) The $SiO_2$ film 405 may be formed by a reactive sputtering method in an $Ar/O_2$ atmosphere by using an Si target. The Si is made to be the anti-reaction film 405 by being oxidized in an $Ar/O_2$ atmosphere. Note that, at that time, the Si target is not necessarily provided directly above the Si substrate surface, but may be provided at a position out of the position directly above the Si substrate surface. Namely, the anti-reaction film 405 may be formed by a so-called off-axis method. By using the off-axis method, the effect that a damage to a hafnium silicate film 404 by plasma at the time of forming film is reduced can be obtained.

(6) The $SiO_2$ film 405 can be formed by a sputtering method in an $Ar/O_2$ atmosphere by using an $SiO_2$ target.

(7) The $SiO_2$ film 405 can be formed by a reactive sputtering method in an $Ar/N_2$ atmosphere by using an Si target. Namely, the Si is made to be an SiN film by being nitrified in an $Ar/N_2$ atmosphere, and next, the $SiO_2$ film 405 is formed by oxidizing the SiN film. As an oxidizing method, the method described in the above-described (3) may be used. Formation of the $SiO_2$ film 405 may be carried out by combining the method of (7) and the method of the above-described (6). For example, the anti-reaction film ($SiO_2$ film) 405 is formed such that an SiON film is firmed by a reactive sputtering method in an $Ar/N_2/O_2$ atmosphere by using an SiO$_2$ target, and next, the SiON film is oxidized by the method described in the above-described (3).

As described above, in the present embodiment, an anti-reaction film formed from a silicon oxide film is provided between a silicate based gate insulating film including hafnium and a polycrystalline silicon gate electrode.

SIXTH EMBODIMENT

Next, a sixth embodiment of the present invention will be described with reference to FIGS. 18 to 20.

Figure 20:
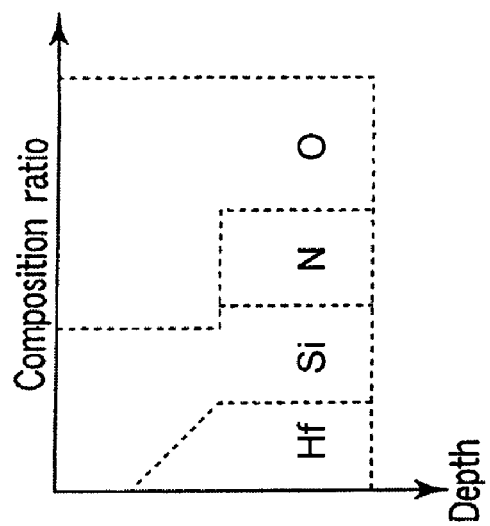
FIG. 20 is a diagram for explanation of another composition ratio of the insulating film for use in the MOS transistor of the sixth embodiment of the invention.
Figure 19:
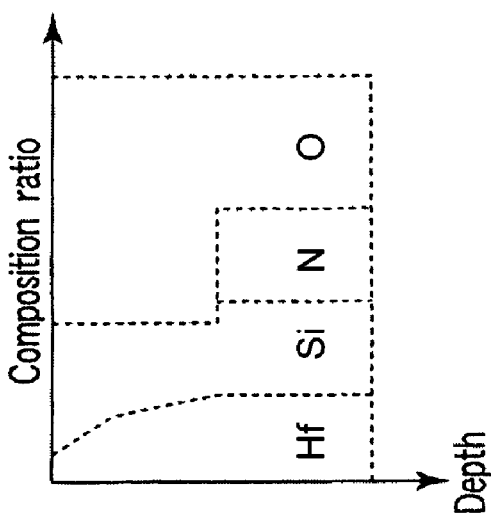
FIG. 19 is a diagram for explanation of a composition ratio of an insulating film for use in the MOS transistor of the sixth embodiment of the invention.
Figure 18:
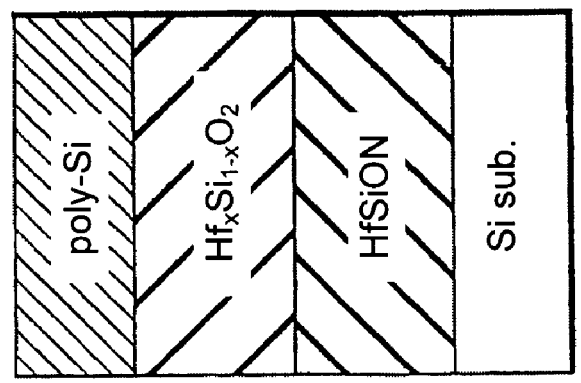
FIG. 18 is a sectional view of a portion of a MOS transistor according to a sixth embodiment of the present invention.

FIG. 18 is a sectional view of a part of a semiconductor apparatus which will be described in this embodiment, and FIGS. 19 and 20 are respectively sectional views for explanation of a composition ratio of an insulating film used for the semiconductor apparatus.

As a high dielectric substance gate insulating film in place of the SiO$_2$ gate insulating film, HfSiON which is a high dielectric constant film has been thought to be promising. However, a shift in a flat band voltage Vfb of the HfSiON gate insulating film is large in a MOS transistor, in particular, in a p-MOS transistor (>0.4V). The fixed charge causing the shift in Nfb is generated due to a dopant and Hf, and is mainly localized at the interface of poly-Si (polycrystalline silicon) and HfSiON.

As shown in FIG. 18, in the semiconductor apparatus of the present embodiment, an HfSiON film which is a high dielectric constant film is formed on a silicon substrate, an Hf$_x$Si$_{1-x}$O$_2$ film which is an anti-reaction film whose Hf density is lower (including x=0) than the Hf density of an HfSiON film is formed on the HfSiON film, and a poly-Si which is a gate electrode is formed on the Hf$_x$Si$_{1-x}$O$_2$ film. Next, a dopant is contained in the gate electrode, and then, the contained dopant is activated. Due to the dopant being contained in the gate electrode and the contained dopant being activated, generation of a fixed charge at the interface of the polycrystalline silicon gate electrode and the HfSiON which is caused by the dopant can be suppressed.

In the present embodiment, HfSiON is used as a high dielectric constant film. The Hf density of the Hf$_x$Si$_{1-x}$O$_2$ film which is an anti-reaction film is low, and the Hf density is preferably less than or equal to $10^{13}$ cm$^{-2}$ in order to suppress generation of a fixed charge. Further, the film thickness of the Hf$_x$Si$_{1-x}$O$_2$ film is required to be greater than or equal to 0.3 nm in order to maintain the effect. Furthermore, with respect to HfSiON, it is preferable that the composition ratio of Hf is Hf/(Hf+Si)=30 atom %, and the composition ratio of N is N/(Hf+Si+O+N)=10 to 20 atom % around. Zr may be used in place of Hf.

Note that, in the insulating film formed from the Hf$_x$Si$_{1-x}$O$_2$ film and the HfSiON film, the Hf density thereof may have a distribution in the depth direction. For example, as in FIG. 20, the Hf density at the interface side of the polycrystalline silicon gate electrode may be made low, and may be made high at the central portion thereof. However, as shown in FIG. 19, when Hf greater than or equal to 1 atom % exists at the interface side of the polycrystalline silicon gate electrode, a shift in a flat band voltage Vfb is brought about. Accordingly, as shown in FIG. 20, SiO$_2$ must exist at the interface side of the polycrystalline silicon gate electrode in order to suppress occurrence of a shift in a flat band voltage Vfb. SiO$_2$ has a function of suppressing a shift in a Vfb.

As described above, in the present embodiment, an anti-reaction film formed from an Hf$_x$Si$_{1-x}$O$_2$ film is provided between an HfSiON gate insulating film and a polycrystalline silicon gate electrode containing a dopant.

In the embodiments as described above, the high dielectric constant film is described as being made of an SiO$_2$ film containing Hf. However, the high dielectric constant film may be made of a film made of a material containing at least one of Hf and Zr, and Si and O, or a film made of a material containing at least one of Hf and Zr, and Si, O and N. Further, the high dielectric constant film may be made of a material selected from the group including HfSiO, HfSiON, HfZrSiO, HfZrSiON, ZrSiO and ZrSiON.

In the embodiments as described, the anti-reaction film provided between the high dielectric constant gate insulation film and the silicon gate electrode comprises an SiO$_2$ film. However, the high dielectric constant film is made of a film made of a material containing SiO$_2$ as a main component and at least one of Hf and Zr, a film made of a material containing SiO$_2$ as a main component, Hf and N, a film made of a material containing SiO$_2$ as a main component, Zr and N, or a film made of a material containing SiO$_2$ as a main component, Hf, Zr and N. The material of the anti-reaction film may be one selected from the group including HfSiO, HfSiON, HfZrSiO, HfZrSiON, ZrSiO and ZrSiON.

With these embodiments, it is possible to suppress a fixed charge generated between the high dielectric constant gate insulation film and the silicon gate electrode. The high dielectric constant film may contain Al, La, Ti, Ta, or Y, other than Hf and Zr.

It is preferable that, when the high dielectric constant film contains one of Hf and Zr, (Hf or Zr)/((Hf or Zr)+Si)=about 10 to 90 atom %, and (N/(Hf or Zr)+Si+O+N))=about 10 to 20 atom %. Also, it is preferable that, when the high dielectric constant film contains Hf and Zr, (Hf and Zr)/((Hf and Zr)+Si)=about 10 to 90 atom %, and (N/(Hf and Zr)+Si+O+N))=about 10 to 20 atom %.

When the anti-reaction film contains one of Hf and Zr, a composition ratio of Hf or Zr is less than 1 atom %, when the anti-reaction film contains Hf and Zr, a total composition ratio of Hf and Zr is less than 1 atom %, and when the anti-reaction film contains N, a composition ratio of N is less than 20 atom %.

Further, the transistors having the gate insulation film structures described in the second to sixth embodiments can be applied to transistors of peripheral circuits such as sense amplifier circuits of a non-volatile memory apparatus, for example, a NAND type flash memory (electrically erasable non-volatile memory). The transistors having the gate insulation film structures described in the second to sixth embodiments can be applied to the transistors forming the sense amplifier circuit.

Figure 21:
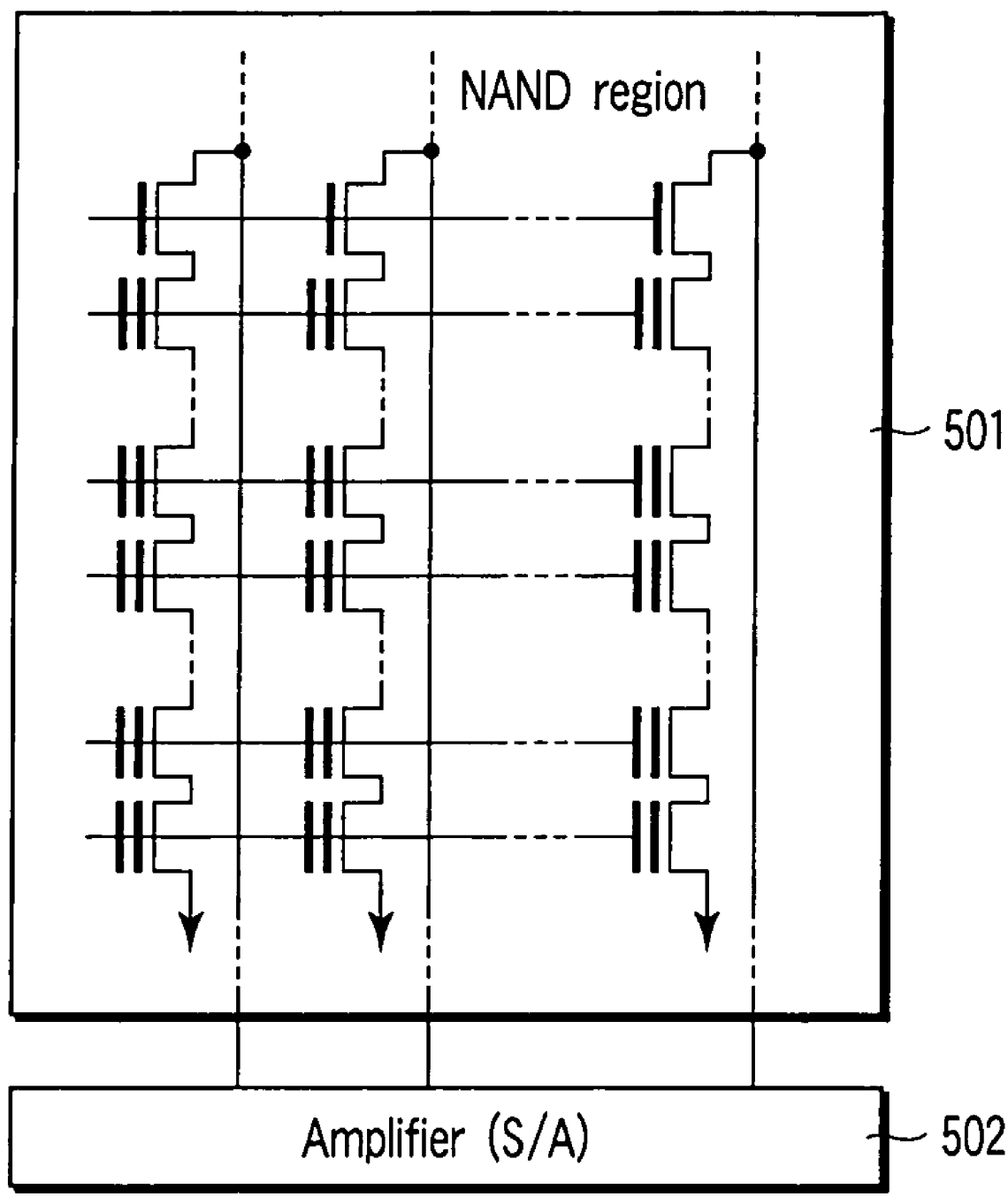
FIG. 21 is a block diagram of a NAND region and a sense amplifier circuit of a NAND type flash memory.

FIG. 21 shows a diagram of a NAND region 501 and a sense amplifier circuit 502 as a peripheral circuit. The transistors having the gate insulation film structures described in the second to sixth embodiments can be applied to the transistors forming the sense amplifier circuit 502.

FIG. 22 is a plan view showing the construction of a NAND type flash memory. FIG. 23 is an equivalent circuit diagram of the construction shown in FIG. 22.

As shown in FIGS. 22 and 23, each NAND cell unit is constructed such that memory cells M1 to M8 which are connected in series are arranged between select transistors S1 and S2. Select gate lines SG1 and SG2 are connected to the select transistors S1 and S2, respectively, and control gate lines (word lines) CG1 to CG8 are connected to the memory cells M1 to M8, respectively. Also, bit lines (BL1, BL2, etc.) are connected to the select transistor S1.

Figure 24:
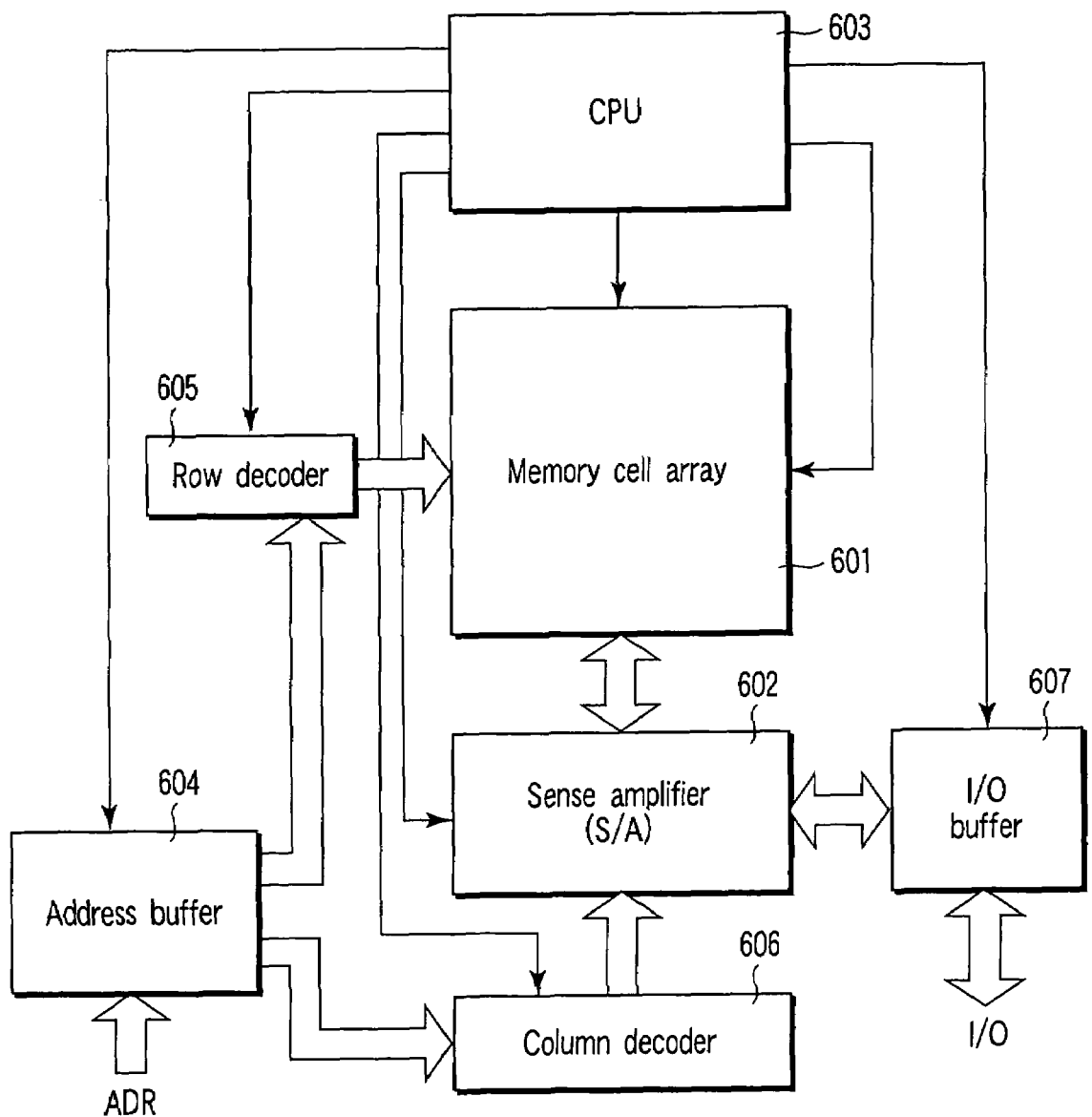
FIG. 24 is a block diagram for schematically showing a DRAM mixed LSI or a SRAM mixed LSI.

FIG. 24 a schematic diagram of a DRAM mixed LSI device or a SRAM mixed LSI device. The memory device comprises a memory cell array 601, a sense amplifier (S/A)

circuit 602, a CPU (Central processing unit) 603, an address buffer 604, a row decoder 605, a column decoder 606, and an I/O (Input/output) buffer 607. The transistors having the gate insulation film structures described in the second to sixth embodiments can be applied to the transistors of the peripheral circuits of the memory device, that is, the sense amplifier circuit 602, the address buffer 604, the row decoder 605, the column decoder 606, the I/O buffer 607, and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor apparatus comprising:
    a semiconductor substrate; and
    a function device formed on the semiconductor substrate,
        wherein the function device comprises a gate structure including a gate insulating film and a gate electrode, the gate insulating film is formed of a high dielectric constant film formed on the semiconductor substrate and an anti-reaction film formed on the high dielectric constant film, and the gate electrode is formed on the anti-reaction film,
    the high dielectric constant film comprises a film selected from the group consisting of:
        a film containing at least one of hafnium (Hf) and zirconium (Zr), and silicon (Si) and oxygen (O), and
        a film containing at least one of Hf and Zr, and Si, O, and nitrogen (N), and
    the anti-reaction film comprises a film selected from the group consisting of:
        a film containing Si, O, and Hf, where an amount of Hf is less than 1 atom %,
        a film containing Si, O, Hf, and Zr, where an amount of Hf and Zr is less than 1 atom %,
        a film containing Si, O, and N, where an amount of N is less than 20 atom %,
        a film containing Si, O, N, and Hf, where an amount of N is less than 20 atom % and an amount of Hf is less than 1 atom %,
        a film containing Si, O, N, and Zr, where an amount of N is less than 20 atom % and an amount of Zr is less than 1 atom %, and
        a film containing Si, O, N, Hf, and Zr, where an amount of N is less than 20 atom % and an amount of Hf and Zr is less than 1 atom %.

2. A semiconductor apparatus according to claim 1, wherein the high dielectric constant film is made of a material selected from the group including hafnium silicate (HfSiO), hafnium silicon oxynitride (HfSiON), hafnium zirconium silicate (HfZrSiO), hafnium zirconium silicon oxynitride (HfZrSiON), zirconium silicate (ZrSiO), and zirconium silicon oxynitride (ZrSiON).

3. A semiconductor apparatus according to claim 1, wherein, when the high dielectric constant film contains one of Hf and Zr, (Hf or Zr)/((Hf or Zr)+Si)=about 10 to 90 atom %, and (N/(Hf or Zr)+Si+O+N))=about 10 to 20 atom %.

4. A semiconductor apparatus according to claim 1, wherein, when the high dielectric constant film contains Hf and Zr, (Hf and Zr)/((Hf and Zr)+Si)=about 10 to 90 atom %, and (N/(Hf and Zr)+Si+O+N))=about 10 to 20 atom %.

5. A semiconductor apparatus according to claim 1, wherein the anti-reaction film is one selected from the group including:
    a film containing Si, O, and at least one of Hf and Zr,
    a film containing Si, O, Hf, and N,
    a film containing Si, O, Zr, and N, and
    a film containing Si, O, Hf, Zr, and N, and
    wherein the material of the high dielectric constant film is one selected from the group including hafnium silicate (HfSiO), hafnium silicon oxynitride (HfSiON), hafnium zirconium silicate (HfZrSiO), hafnium zirconium silicon oxynitride (HfZrSiON), zirconium silicate (ZrSiO), and zirconium silicon oxynitride (ZrSiON).

6. A semiconductor apparatus according to claim 1, wherein the semiconductor substrate comprises a silicon substrate or an SOI substrate.

7. A semiconductor apparatus according to claim 1, wherein the function device comprises a transistor or a capacitor.

8. A semiconductor apparatus according to claim 7, wherein the transistor comprises an n-type MOS transistor having n-channel region.

9. A semiconductor apparatus according to claim 7, wherein the transistor comprises a p-type MOS transistor having p-channel region.

10. A semiconductor apparatus according to claim 7, wherein the transistor comprises a complementary MOS transistor having p-channel region and n-channel region.

11. A semiconductor apparatus according to claim 1, wherein the gate electrode contains Si as a main component and at least one of B, P, and As.

12. A semiconductor apparatus according to claim 1, wherein the gate electrode comprises $Si_{1-x}Ge_x (0 \leq x \leq 0.8)$.

13. A semiconductor apparatus according to claim 1, wherein the gate electrode contains Si and a metal as a main component, and the metal is one selected from the group of Fe, Co, Ni, Ti, Hf, Zr, and W.

* * * * *

UNITED STATES PATENT AND TRADEMARK OFFICE
CERTIFICATE OF CORRECTION

PATENT NO. : 7,265,427 B2 Page 1 of 1
APPLICATION NO. : 10/927115
DATED : September 4, 2007
INVENTOR(S) : Kaneko et al.

It is certified that error appears in the above-identified patent and that said Letters Patent is hereby corrected as shown below:

Claim 1, column 13, line 39, after "Hf is less than 1 atom %," insert the following line:

--a film containing Si, O, and Zr, where an amount of Zr is less than 1 atom %,--.

Signed and Sealed this

Thirteenth Day of November, 2007

JON W. DUDAS
*Director of the United States Patent and Trademark Office*